(12) United States Patent
Willis et al.

(10) Patent No.: US 10,729,010 B2
(45) Date of Patent: Jul. 28, 2020

(54) SOCKET CAVITY INSULATOR

(71) Applicant: Intel Corporation, Santa Clara, CA (US)

(72) Inventors: Daniel Willis, Portland, OR (US); Dan H. Gerbus, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/941,427

(22) Filed: Mar. 30, 2018

(65) Prior Publication Data

US 2019/0306984 A1 Oct. 3, 2019

(51) Int. Cl.
| | |
|---|---|
| *H05K 1/18* | (2006.01) |
| *H05K 1/11* | (2006.01) |
| *H05K 3/46* | (2006.01) |
| *H01L 23/32* | (2006.01) |
| *H01L 23/367* | (2006.01) |

(52) U.S. Cl.
CPC ............. *H05K 1/181* (2013.01); *H01L 23/32* (2013.01); *H01L 23/367* (2013.01); *H05K 1/11* (2013.01); *H05K 3/4644* (2013.01); *H05K 2201/0145* (2013.01); *H05K 2201/0154* (2013.01); *H05K 2201/09036* (2013.01); *H05K 2201/10015* (2013.01); *H05K 2201/10325* (2013.01); *H05K 2201/10515* (2013.01)

(58) Field of Classification Search
CPC ............................... H05K 1/181; H01L 23/32
See application file for complete search history.

(56) References Cited

U.S. PATENT DOCUMENTS

| 6,722,896 B2* | 4/2004 | McGrath | H01R 43/007 |
| | | | 439/271 |
| 7,037,115 B2* | 5/2006 | Renfro | H05K 7/1053 |
| | | | 439/68 |
| 7,578,678 B2* | 8/2009 | Xie | H05K 7/1061 |
| | | | 439/378 |
| 2006/0052011 A1* | 3/2006 | Goodman | H01R 13/2421 |
| | | | 439/700 |
| 2008/0142962 A1* | 6/2008 | Stone | H01L 23/50 |
| | | | 257/724 |

* cited by examiner

*Primary Examiner* — William H. Mayo, III
*Assistant Examiner* — Hiram E Gonzalez
(74) *Attorney, Agent, or Firm* — Schwegman Lundberg & Woessner, P.A.

(57) ABSTRACT

The present subject matter may include an electronic device. The electronic device may include a motherboard socket body. The motherboard socket body may be adapted to couple with a processor. The motherboard socket body may define an aperture in the motherboard socket body. The electronic device may include a socket insulator. The socket insulator may be coupled with the aperture in the motherboard socket body. The socket insulator may include an insulator body that may be sized and shaped to close the aperture in the motherboard socket body. The socket insulator may be configured to isolate electrical communication in portions of the motherboard socket body.

11 Claims, 5 Drawing Sheets

SOCKET CAVITY INSULATOR

BACKGROUND

An electronic device may include a motherboard with a motherboard socket body. The motherboard socket body may be adapted to couple with an integrated circuit (e.g., a die), such as a processor. The motherboard socket body may define an aperture (e.g., a cavity, opening, or the like) in the motherboard socket body. Electrical components (e.g., capacitors, inductors, resistors, or the like) may be positioned within the aperture.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, that a problem to be solved may include reducing the dimensions of electronic devices. The present inventors have recognized, among other things, that a problem to be solved may include improving signal integrity within the electronic devices, such as the signal integrity between a processor and a motherboard. The present subject matter may help provide a solution to these problems, such as by providing a socket cavity insulator. The socket cavity insulator may help prevent electrical shorting between components of an electronic device, such as electrical shorting between components of the processor and components of the motherboard. The prevention of electrical shorting between components of the electronic device may help improve signal integrity within the electronic device because the spacing between the components may be reduced (in comparison to electronic devices without the present subject matter). Reducing the spacing between the components may correspondingly improve signal integrity within the electronic device because electrical signals are transmitted over shorter distances, thereby reducing electrical interference with neighboring signals (e.g., Z-axis crosstalk).

The present subject matter may include an electronic device. The electronic device may include a motherboard socket body. The motherboard socket body may be adapted to couple with a processor. The motherboard socket body may define an aperture in the motherboard socket body. The electronic device may include a socket insulator. The socket insulator may be coupled with the aperture in the motherboard socket body. The socket insulator may include an insulator body that may be sized and shaped to close the aperture in the motherboard socket body.

This overview is intended to provide an overview of subject matter of the present patent application. It is not intended to provide an exclusive or exhaustive explanation of the invention.

Figure 1:
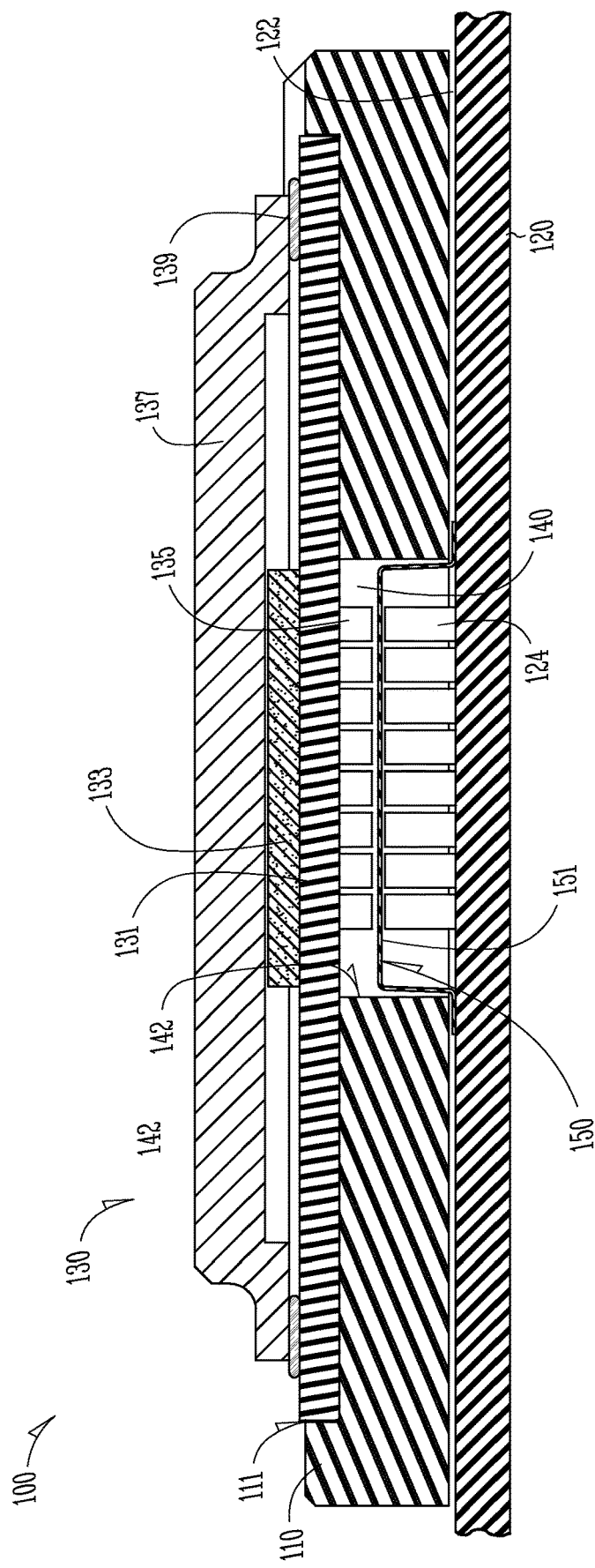
FIG. 1 illustrates a cross-sectional view of one example of an electronic device.

FIG. 1 illustrates a cross-sectional view of one example of an electronic device 100. The electronic device 100 may include a socket body 110. The socket body 110 may be coupled to a motherboard 120. A gap 122 may exist between the socket body 110 and the motherboard 120. The gap 122 may be an aperture coupling feature. The socket body 110 may include a socket recess 111 that may be adapted to couple with (e.g., receive, and interconnect with) an integrated circuit, such as a processor 130. The socket recess 111 may include a mating surface (e.g., a lower surface of the socket recess 111) adapted to mate with the integrated circuit.

The processor 130 may include a die 131 that may be coupled to a substrate 133. The die 131 may be positioned on a first side of the substrate 133. The processor 130 may include an integrated heat spreader 137 coupled to the substrate 133, such as with a seal 139. The integrated heat spreader 137 may be in communication with the die 131 such that the integrated heat spreader 137 dissipates heat generated by the die 131. An interface material may be applied at an interface between the integrated heat spreader 137 and the die 131. Th die 131 may be lidded (e.g., with the integrated heat spreader 137), encapsulated (e.g., with an overmold material), or bare (e.g., exposed on a surface of the substrate 133).

Referring again to FIG. 1, the processor 130 may include processor electrical components 135 (e.g., capacitors, inductors, resistors, or the like) coupled the substrate 133. The processor electrical components 135 may be positioned on a second side of the substrate 133. The processor electrical components 135 may be adapted to regulate power supplied to the processor 130.

The socket body 110 may define an aperture 140 (e.g., cavity, opening, hole, cut-out, or the like) in the socket body 110. The socket body 110 may include aperture walls 142 that may define the aperture 140. The aperture 140 may extend from the socket recess 111 to the motherboard 120. The aperture 140 may form a direct interface with (e.g., open into) the gap 122 between the socket body 110 and the motherboard 120. Stated another way, the aperture 140 and the gap 122 may form a continuous cavity.

The electronic device 100 may include a socket cavity insulator 150 (hereinafter "the insulator 150"). The insulator 150 may include polymer materials (e.g., polyimides, such as Kapton; or polyester, such as Mylar) or dielectric materials. The polymer material may be non-conductive, and the insulator 150 may be electrically insulative.

As shown in FIG. 1, the insulator 150 may include an insulator body 151 with a first (e.g., top) side and a second (e.g., bottom) side. The insulator 150 may be adapted to couple with the socket body 110, such as with the aperture 140. The insulator 150 may be sized and shaped to close (e.g., seal, encompass, fill, block, or the like) the aperture 140. As shown in FIG. 1, the insulator body 151 may extend between the aperture walls 142.

The insulator 150 may be recessed within the aperture 140. Stated another way, the insulator body 151 may be positioned within the aperture 140 at a distance from a bottom of the socket recess 111. The insulator 150 may be positioned within the aperture 140 such that the insulator 150 divides the aperture 140 into a first (e.g., upper) portion of the aperture 140 and a second (e.g., lower) portion of the aperture 140. The dividing the of the aperture 140 into the first and second portion may help isolate (e.g., physically and/or electrically) electrical components positioned within the aperture 140.

For example, the motherboard 120 may include motherboard electrical components 124 (e.g., capacitors, inductors, resistors, or the like) that may be positioned in the aperture 140 when the socket body 110 is coupled to the motherboard 120. The insulator 150 may be coupled (e.g., with corresponding coupling features, or with an adhesive) to the socket body 110 such that the insulator body 151 closes the aperture 1140. The motherboard electrical components 124 may be positioned on the second (e.g., lower) side of the insulator 1150.

Referring again to FIG. 1, the insulator 1150 may help isolate the motherboard electrical components 124 from additional electrical components positioned within the aperture 140, such as the processor electrical components 135. The processor 130 may be coupled to the socket body 110 such that the processor electrical components 135 are positioned in the aperture 140. The processor electrical components 135 may be positioned on the first (e.g., upper side) of the insulator 150. The positioning of the processor electrical components 135 on the first side of the insulator 150 may isolate the processor electrical components 135 from the motherboard electrical components 124 positioned on the second side of the insulator 150.

The processor electrical components 135 may be positioned proximate the motherboard electrical components 124 in the aperture 140. Electrical faults, such as a short circuit, may occur between the motherboard electrical components 124 and the processor electrical components 135 when the motherboard electrical components 124 are proximate the processor electrical components 135. For example, a capacitor of the motherboard electrical components 124 may short circuit when proximate with a capacitor of the processor electrical components 135. Variations in dimensions (e.g., tolerances) of the components of the electronic device 100 may reduce the dimension between the motherboard electrical components 124 and the processor electrical components 135 such that electrical faults occur within the electronic device 100.

As described herein, the insulator 150 may help isolate the motherboard electrical components 124 and the processor electrical components 135. Isolating the motherboard electrical components 124 and the processor electrical components 135 may allow for the dimension (e.g., space or gap) between the motherboard electrical components 124 and the processor electrical components 135 to be reduced, thereby reducing the size of the electronic device 100. Additionally, the insulator 150 may help allow for looser tolerances in the electronic device 100 (e.g., the dimension between the motherboard electrical components 124 and the processor electrical components 135), because the insulator 150 may isolate the motherboard electrical components 124 and the processor electrical components 135, and may thereby prevent electrical faults that could occur in the absence of the insulator 150. Additionally, the insulator 150 may be a condensate barrier, and may help minimize formation of condensation on the motherboard electrical components 124 and the processor electrical components 135, such as when liquid nitrogen is used to cool the electronic device 100.

Referring again to FIG. 1, a height of the socket body 110 may be reduced, and thereby reduce the distance between the motherboard electrical components 124 and the processor electrical components 135. Reducing the height of the socket body 110 may reduce a distance that electrical signals are transmitted, through the socket body 110, between the processor 130 and the motherboard 120. Reducing the distance that electrical signals are transmitted may improve signal integrity between the processor 130 and the motherboard 120. Improving signal integrity between the processor 130 and the motherboard 120 may improve the computing performance of the electronic device 100.

A gap (e.g., space) may be defined between the insulator 150 and the motherboard electrical components 124 or the processor electrical components 135. The insulator 150 may form a direct interface with the motherboard electrical components 124 or the processor electrical components 135. The insulator 150 may be adapted to deflect when the insulator 150 forms a direct interface with the motherboard electrical components 124 or the processor electrical components 135.

Reducing the dimension (e.g., gap) between motherboard electrical components 124 and the processor electrical components 135 may cause electrical faults. The insulator 150 may help improve signal integrity of the electronic device 100 by isolating the motherboard electrical components 124 and the processor electrical components 135. For example, the positioning of the insulator 150 in the aperture 140 may help reduce the minimum distance (e.g., gap) that is required to prevent electrical faults between the motherboard electrical components 124 and the processor electrical components 135.

Figure 2:
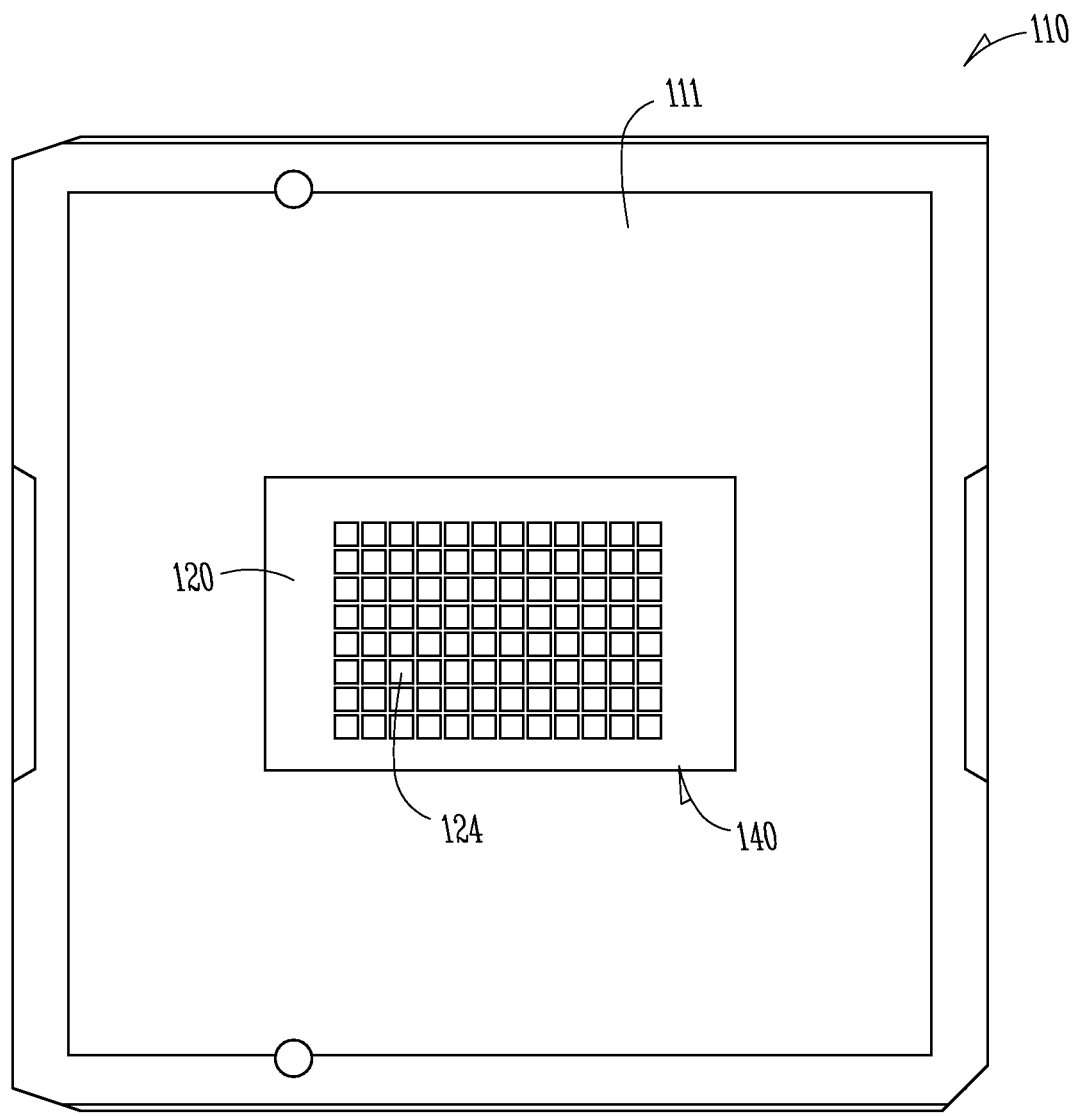
FIG. 2 illustrates a top view of one example of a socket body.

FIG. 2 illustrates a top view of one example of the socket body 110. The socket body 110 may include the socket recess 111 and the aperture 140. The motherboard electrical components 124 may be positioned in the aperture 140. The motherboard electrical components 124 may be arranged in a grid.

Figure 3:
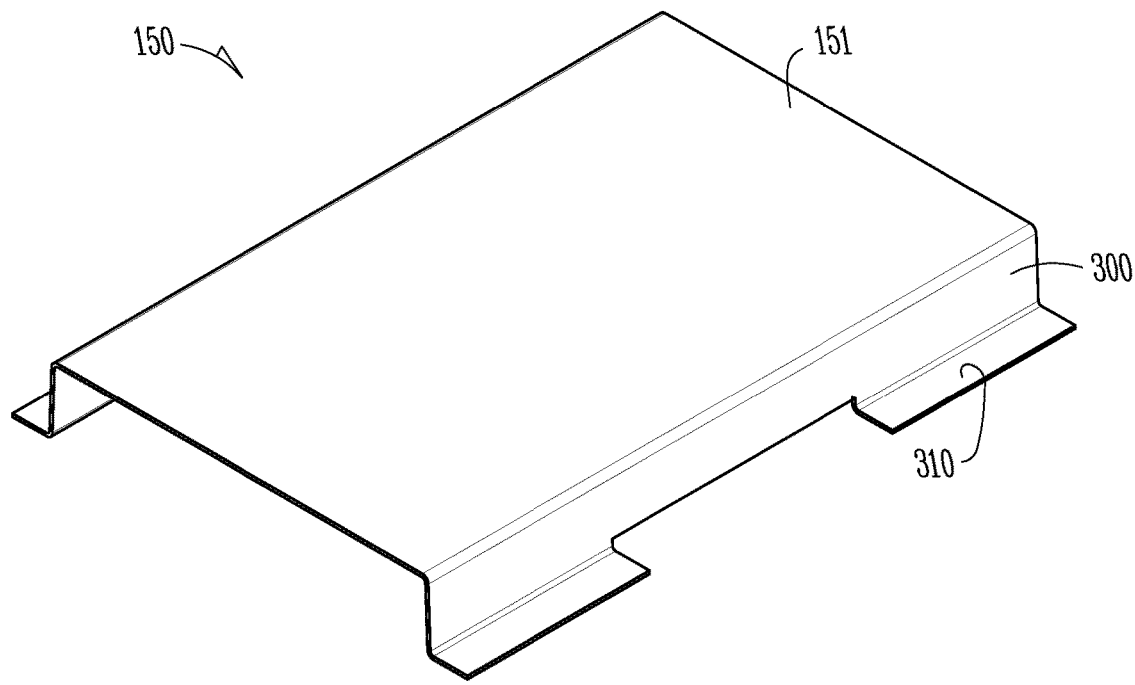
FIG. 3 illustrates a perspective view of one example of a socket cavity insulator.

FIG. 3 illustrates a perspective view of one example of the socket cavity insulator 150 including the insulator body 151. The insulator body 151 may include insignia (e.g., brand names, logos, decorative designs, trademarks, or the like) printed on a face (e.g., a top surface) of the insulator body 151.

The socket cavity insulator 150 ("insulator 150") may include a leg 300 protruding (e.g., at an angle) from the insulator body 151. The leg 300 may be included in insulator coupling features that may be adapted to help couple the insulator 150 with the socket body 110. The leg 300 may be adapted to engage with the socket body 110, such as with the walls 142 of the aperture 140 (shown in FIG. 1). The leg 300 may be biased against the walls 142 of the aperture 140 such that the insulator 150 couples with the socket body 110 (e.g., by an interference fit, or through frictional forces between the socket body 110 and the insulator 150). The leg 300 of the insulator 150 may form a direct interface with the motherboard 120.

The insulator 150 may include a foot 310 protruding from the leg 300. The foot may be included in the insulator coupling features. The foot 310 may be adapted to engage with the socket body 110. The foot 310 may be sized and shaped to engage with (e.g., be received by) the gap 122 (shown in FIG. 1) between the socket body 110 and the motherboard 120. The engagement of the foot 310 with the gap 122 may help couple the insulator 150 with the socket body 110. For example, the leg 300 of the insulator 150 may be deflected inward (e.g., by overcoming the bias of the leg 300), such that the insulator 150 may be positioned in the aperture 140. The insulator 150 may be positioned proximate the motherboard 120, and the insulator 150 may be allowed to relax. The foot 310 may engage with (e.g., slide into) the gap 122 (shown in FIG. 1), and may thereby help couple the insulator 150 with the socket body 110. The leg 300, and the foot 310, may form a direct interface with the aperture 140, the walls 142 of the aperture 140, the socket body 110, the gap 122, and the motherboard 120. The foot 310 may engage with a periphery of the aperture 140.

Figure 4:
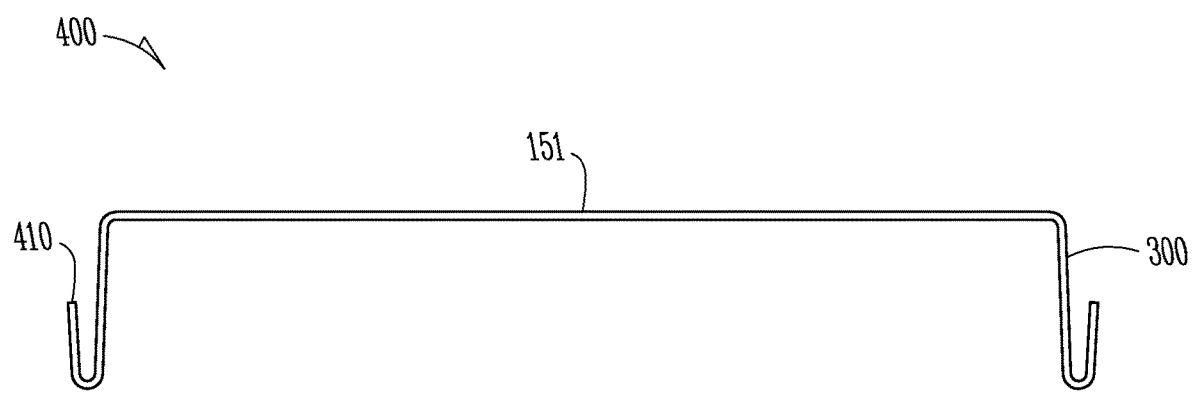
FIG. 4 illustrates a side view of one example of a socket cavity insulator.

FIG. 4 illustrates a side view of one example of a socket cavity insulator 400 including the insulator body 151 and the leg 300. The socket cavity insulator 400 may include a foot 410. The foot 410 may be sized and shaped to engage with the socket body 110 (shown in FIG. 1), and thereby help couple the socket cavity insulator 400 with the socket body 110. For example, the walls 142 (shown in FIG. 1) of the aperture 140 may define an aperture coupling feature, such as a recess in the walls 142. The recess in the walls 142 may be sized and shaped to receive the foot 410. Similarly, the foot 410 may be sized and shaped to engage with the recess in the walls 142 of the aperture 140. The engagement of the foot 410 with the socket body 110 may help couple the socket cavity insulator 400 with the socket body 110.

Figure 5:
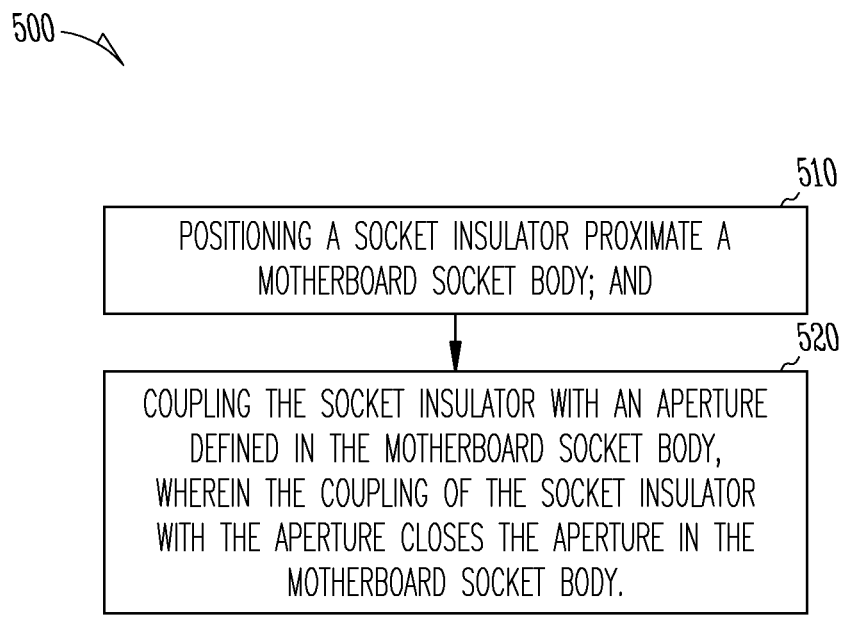
FIG. 5 shows one example of a method for manufacturing an electronic device.

FIG. 5 shows one example of a method 500 for manufacturing an electronic device, including one or more of the electronic devices described herein. In describing the method 500, reference is made to one or more components, features, functions and steps previously described herein. Where convenient, reference is made to the components, features, steps and the like with reference numerals. The reference numerals provided are exemplary and are not exclusive. For instance, components, features, functions, steps and the like described in the method 500 include, but are not limited to, the corresponding numbered elements provided herein and other corresponding elements described herein (both numbered and unnumbered) as well as their equivalents.

The method 500 can include at operation 510 positioning a socket insulator 150 proximate a motherboard socket body 110. The method 500 can include at operation 520 coupling the socket insulator 150 with an aperture 140 defined in the motherboard socket body 110. The coupling of the socket insulator 150 with the aperture 140 closes the aperture 140 in the motherboard socket body 110.

The method 500 may include coupling a processor 130 with the motherboard socket body 110. The coupling of the processor 130 with the motherboard socket body 110 may correspondingly cover the aperture 140 in the motherboard socket body 110. The method 500 may include positioning at least one capacitor (e.g., the processor electrical components 135 of FIG. 1), that may be coupled with the processor 130, within the aperture 140 in the motherboard socket body 110.

The method 500 may include recessing the socket insulator 150 such that the socket insulator 150 is not coplanar with a mating surface of the motherboard socket body 110. The method 500 may include applying an adhesive to either the socket insulator 150 or the motherboard socket body 110. The adhesive may help couple the socket insulator 150 with the motherboard socket body 110. The method 500 may include coupling the motherboard socket body 110 with a motherboard 120.

Figure 6:
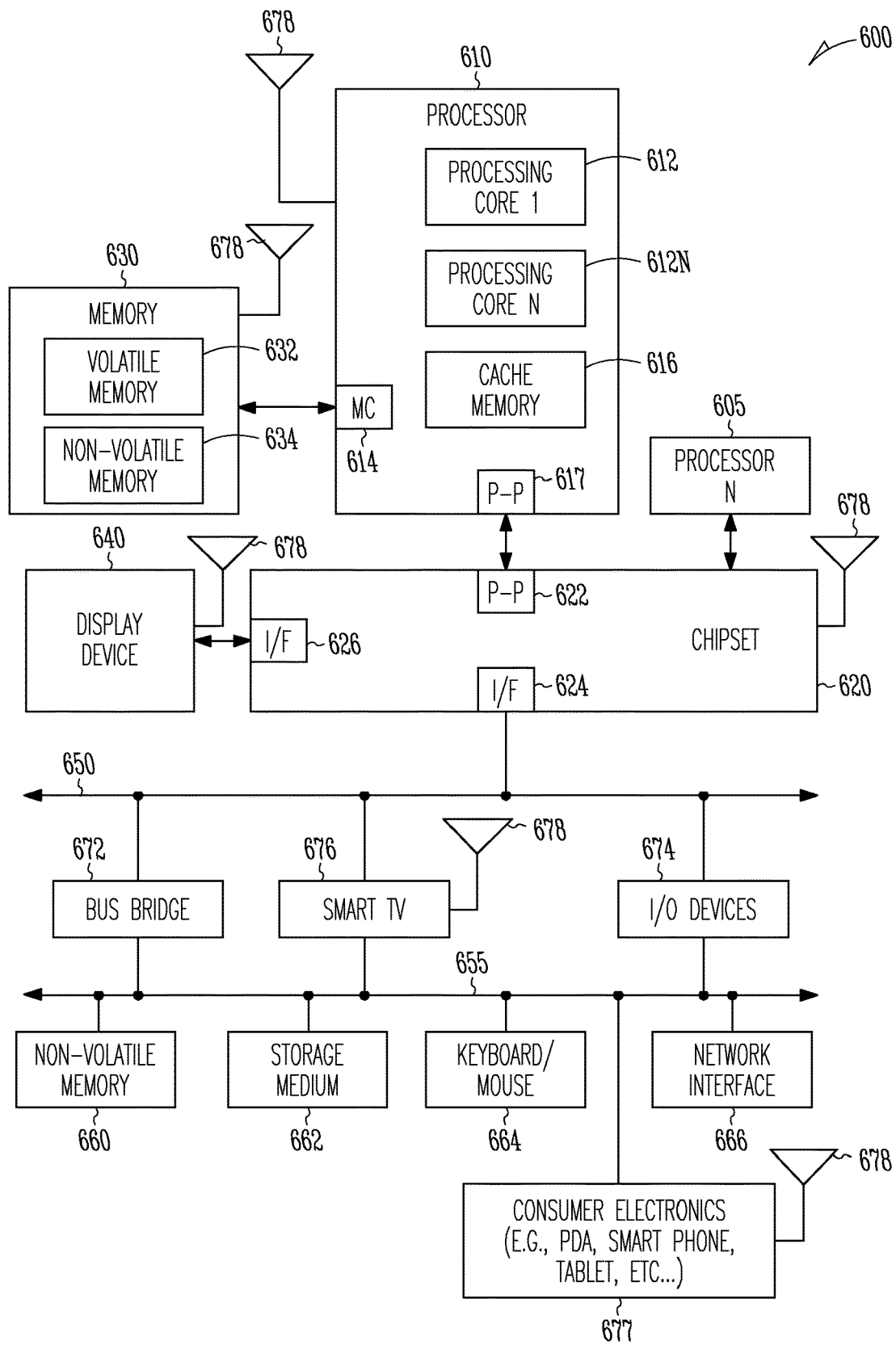
FIG. 6 illustrates a system level diagram, depicting an example of an electronic device (e.g., system) including the electronic device, the socket body, or the socket cavity insulator.

FIG. 6 illustrates a system level diagram, depicting an example of an electronic device (e.g., system) including the electronic device 100, the socket body 110, or the socket cavity insulator 150, as described in the present disclosure. FIG. 6 is included to show an example of a higher level device application for the electronic device 100, the socket body 110, or the socket insulator 150. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In one embodiment, processor 610 has one or more processor cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, an interface for wireless antenna 678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the example system, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices, including a bus bridge 672, a smart TV 676, I/O devices 674, nonvolatile memory 660, a storage medium (such as one or more mass storage devices) 662, a keyboard/mouse 664, a network interface 666, and various forms of consumer electronics 677 (such as a PDA, smart phone, tablet etc.), etc. In one embodiment, chipset 620 couples with these devices through an interface 624. Chipset 620 may also be coupled to a wireless antenna 678 to communicate with any device configured to transmit and/or receive wireless signals.

Chipset 620 connects to display device 640 via interface 626. Display 640 may be, for example, a liquid crystal display (LCD), a plasma display, cathode ray tube (CRT) display, or any other form of visual display device. In some embodiments of the example system, processor 610 and chipset 620 are merged into a single SOC. In addition, chipset 620 connects to one or more buses 650 and 655 that interconnect various system elements, such as I/O devices 674, nonvolatile memory 660, storage medium 662, a keyboard/mouse 664, and network interface 666. Buses 650 and 655 may be interconnected together via a bus bridge 672.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

Various Notes & Examples

Aspect 1 may include or use subject matter (such as an apparatus, a system, a device, a method, a means for performing acts, or a device readable medium including instructions that, when performed by the device, may cause the device to perform acts, or an article of manufacture), such as may include or use an electronic device. The electronic device may include a motherboard socket body. The motherboard socket body may be adapted to couple with a processor. The motherboard socket body may define an aperture in the motherboard socket body.

The electronic device may include a socket insulator. The socket insulator may be coupled with the aperture in the motherboard socket body. The socket insulator may include an insulator body. The insulator body may be sized and shaped to close the aperture in the motherboard socket body.

Aspect 2 may include or use, or may optionally be combined with the subject matter of Aspect 1, to optionally include or use that the insulator body may be recessed within the aperture, such as when the socket insulator is coupled with the aperture.

Aspect 3 may include or use, or may optionally be combined with the subject matter of one or any combination of Aspects 1 or 2 to optionally include or use that a portion of the socket insulator can be biased toward the aperture, such as toward a wall of the aperture in the motherboard socket body.

Aspect 4 may include or use, or may optionally be combined with the subject matter of one or any combination of Aspects 1 through 3 to optionally include or use a capacitor. The capacitor may be positioned within the aperture. The capacitor may be positioned on a first side of the socket insulator.

Aspect 5 may include or use, or may optionally be combined with the subject matter of Aspect 4 to optionally include or use that a gap may exist between the first side of the socket insulator and the capacitor.

Aspect 6 may include or use, or may optionally be combined with the subject matter of one or any combination of Aspects 4 or 5 to optionally include or use that the socket insulator may form a direct interface with the capacitor.

Aspect 7 may include or use, or may optionally be combined with the subject matter of Aspect 6 to optionally include or use that a portion of the socket insulator may be adapted to deflect in response to forming a direct interface with the capacitor.

Aspect 8 may include or use, or may optionally be combined with the subject matter of one or any combination of Aspects 1 through 7 to optionally include or use that the socket insulator may include an insulator coupling feature. The insulator coupling feature may be adapted to couple with a corresponding aperture coupling feature.

Aspect 9 may include or use, or may optionally be combined with the subject matter of Aspect 8 to optionally include or use that the aperture coupling feature may be defined by a wall of the aperture in the motherboard socket body.

Aspect 10 may include or use, or may optionally be combined with the subject matter of one or any combination of Aspects 1 through 9 to optionally include or use that the socket insulator may include a lip. The lip may be sized and shaped such that the lip may engage with a periphery of the aperture.

Aspect 11 may include or use, or may optionally be combined with the subject matter of one or any combination of Aspects 1 through 10 to optionally include or use that the insulator body may include polyimides or polyester.

Aspect 12 may include or use subject matter (such as an apparatus, a system, a device, a method, a means for performing acts, or a device readable medium including instructions that, when performed by the device, may cause the device to perform acts, or an article of manufacture), such as may include or use an electronic device. The electronic device may include a motherboard. The motherboard may include a motherboard socket body. The motherboard socket body may define an aperture in the motherboard socket body.

The electronic device may include a processor. The processor may be coupled with the motherboard socket body. The motherboard socket body may cover the aperture in the motherboard socket body. The electronic device may include a socket insulator. The socket insulator may be coupled with the aperture in the motherboard socket body. The socket insulator may include an insulator body. The insulator body may be sized and shaped to close the aperture in the motherboard socket body.

Aspect 13 may include or use, or may optionally be combined with the subject matter of Aspect 1, to optionally include or use that the motherboard may include a motherboard capacitor. The motherboard capacitor may be positioned on a first side of the socket insulator. The processor may include a processor capacitor. The processor capacitor may be positioned on a second side of the socket insulator.

Aspect 14 may include or use, or may optionally be combined with the subject matter of Aspect 13 to optionally include or use that a gap may exist between the processor capacitor and the second side of the socket insulator.

Aspect 15 may include or use, or may optionally be combined with the subject matter of one or any combination of Aspects 12 through 14 to optionally include or use that the insulator body may be compressed between the processor capacitor and the motherboard capacitor.

Aspect 16 may include or use subject matter (such as an apparatus, a system, a device, a method, a means for performing acts, or a device readable medium including instructions that, when performed by the device, may cause the device to perform acts, or an article of manufacture), such as may include or use a method for manufacturing an electronic device. The method may include positioning a socket insulator proximate a motherboard socket body. The method may include coupling the socket insulator with an aperture defined in the motherboard socket body. The coupling of the socket insulator with the aperture may close the aperture in the motherboard socket body.

Aspect 17 may include or use, or may optionally be combined with the subject matter of Aspect 16, to optionally include or use that the method may include coupling a processor with the motherboard socket body. The coupling of the processor with the motherboard socket body may correspondingly cover the aperture in the motherboard socket body.

Aspect 18 may include or use, or may optionally be combined with the subject matter of one or any combination of Aspects 16 or 17 to optionally include or use that the method may include positioning at least one capacitor coupled with a processor within the aperture in the motherboard socket body.

Aspect 19 may include or use, or may optionally be combined with the subject matter of one or any combination of Aspects 16 through 18 to optionally include or use that the method may include recessing the socket insulator such that the socket insulator is not coplanar with a mating surface of the motherboard socket body.

Aspect 20 may include or use, or may optionally be combined with the subject matter of one or any combination of Aspects 16 through 19 to optionally include or use that the method may include applying an adhesive to either the socket insulator or the motherboard socket body.

Aspect 21 may include or use, or may optionally be combined with the subject matter of one or any combination of Aspects 16 through 20 to optionally include or use that the method may include coupling the motherboard socket body with a motherboard.

Each of these non-limiting examples may stand on its own, or may be combined in various permutations or combinations with one or more of the other examples.

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The invention claimed is:

1. An electronic device, comprising:
   a motherboard including:
      a motherboard socket body, the motherboard socket body defining an aperture in the motherboard socket body; and
      a motherboard capacitor;
   a processor coupled with the motherboard socket body and thereby covering the aperture in the motherboard socket body, wherein the processor includes a processor capacitor;
   a socket insulator coupled with the aperture in the motherboard socket body, the socket insulator including an insulator body sized and shaped to close the aperture in the motherboard socket body; and
   wherein:
      the socket insulator is configured to divide the aperture into a first portion and a second portion;
      the motherboard capacitor is positioned in the first portion and on a first side of the socket insulator;
      the processor capacitor is positioned in the second portion and on a second side of the socket insulator; and
      the socket insulator is located between the motherboard capacitor and the processor capacitor, and the socket insulator isolates the motherboard capacitor from the processor capacitor.

2. The electronic device of claim 1, wherein the insulator body is recessed within the aperture when the socket insulator is coupled with the aperture.

3. The electronic device of claim 1, wherein a gap exists between the processor capacitor and the second side of the socket insulator.

4. The electronic device of claim 1, wherein the insulator body is compressed between the processor capacitor and the motherboard capacitor.

5. The electronic device of claim 1, wherein the insulator body is configured to be continuous between walls of the aperture.

6. The electronic device of claim 1, wherein the socket insulator forms a direct interface with one or more of the motherboard capacitor or the processor capacitor.

7. The electronic device of claim 6, wherein a portion of the socket insulator is adapted to deflect in response to forming a direct interface with the capacitor.

8. The electronic device of claim 1, wherein the socket insulator includes an insulator coupling feature adapted to couple with a corresponding aperture coupling feature.

9. The electronic device of claim 1, wherein the socket insulator does not include an electrically conductive material.

10. The electronic device of claim 1, wherein the socket insulator includes a lip sized and shaped such that the lip is engaged with the motherboard socket body at a periphery of the aperture.

11. The socket insulator of claim 1, wherein the insulator body includes polyimides or polyester.

* * * * *